(12) United States Patent
Schoonover et al.

(10) Patent No.: US 7,106,576 B2
(45) Date of Patent: Sep. 12, 2006

(54) JAW SPACING STABILIZER

(75) Inventors: Marc Evan Schoonover, Lincoln, IL (US); James Monroe Campbell, Atlanta, IL (US); Jeffrey Lee Johnson, Lincoln, IL (US); Syed Manzoor Karim, Lincoln, IL (US); Serle Keith Cupp, Mason City, IL (US); Thomas Edward Culnan, Lincoln, IL (US)

(73) Assignee: Eaton Corporation, Cleveland, OH (US)

( * ) Notice: Subject to any disclaimer, the term of this patent is extended or adjusted under 35 U.S.C. 154(b) by 171 days.

(21) Appl. No.: 10/848,328

(22) Filed: May 18, 2004

(65) Prior Publication Data

US 2005/0259384 A1    Nov. 24, 2005

(51) Int. Cl.
*H02B 1/00* (2006.01)
(52) U.S. Cl. .................. 361/668; 439/146; 439/508

(58) Field of Classification Search ........ 361/659–672; 439/146, 167, 508, 517, 654
See application file for complete search history.

(56) References Cited

U.S. PATENT DOCUMENTS

| 4,203,146 | A | | 5/1980 | Sabatella et al. |
| 4,622,753 | A | | 11/1986 | Jones et al. |
| 5,145,403 | A | * | 9/1992 | Schaffert et al. ............ 439/508 |
| 5,951,324 | A | | 9/1999 | Campbell et al. |
| 5,980,311 | A | | 11/1999 | Campbell et al. |
| 6,478,589 | B1 | * | 11/2002 | Robinson et al. ........... 439/146 |

* cited by examiner

*Primary Examiner*—Gregory Thompson
(74) *Attorney, Agent, or Firm*—Martin J. Moran

(57) ABSTRACT

A removable spacing stabilizer for a jaw meter bus assembly having two pairs of generally parallel flat, elongated busses, each bus having a cantilevered second leg. The removable spacing stabilizer includes a generally planar member made from a generally rigid, non-conductive material. The planar member has a positioning slot for each of the bus cantilevered second legs. Whereby the planar member may be coupled to said jaw meter bus assembly with each bus cantilevered leg disposed in a positioning slot and whereby the bus cantilevered legs are held in a selected orientation.

20 Claims, 4 Drawing Sheets

JAW SPACING STABILIZER

BACKGROUND OF THE INVENTION

1. Field of the Invention

The present invention relates to electric power distribution systems and, more specifically, to a spacing stabilizer structured to stabilize and position the meter jaw buses so that a meter assembly may engage the meter jaw buses.

2. Background Information

Meters are used to measure the quantity of electric power delivered to a location, such as a building, from a common feeder system. Typically, the meter is disposed in a meter compartment within an enclosure. Elongated buses, that is line and load buses, extend along the rear of the enclosure. There are, typically, two 110 volt line buses which are connected to one or more utility lines. The corresponding load buses are coupled to the building's electrical system.

The meter compartment has a plurality of flat, elongated, L-shaped buses collectively identified as the "meter jaw buses." The L-shaped buses are disposed in aligned, opposing pairs. One L-shaped bus in each pair of buses is connected to a line bus or a load bus. Each L-shaped bus has two legs. A first leg extends generally parallel, and adjacent to, the back of the enclosure and is coupled to a base assembly as well as either the line or load bus. Each L-shaped bus second leg extends generally perpendicular to the first end and toward the front of the enclosure. That is, each bus second leg is cantilevered and extends toward the front of the enclosure. The meter jaw buses are mounted on a base unit, which is made from a non-conductive material, coupled to the back of the enclosure. At the tip of each meter jaw bus is a jaw assembly structured to engage a meter bus disposed within a meter assembly bus tabs.

A meter assembly includes a housing in which the metering devices are enclosed. The housing includes a plurality of bus tabs. Each bus tab is structured to engage the jaw assembly on each meter jaw bus. The bus tabs are aligned in a structured pattern. The bus tabs may have chamfered edges to assist in guiding the bus tabs into the jaw assembly. A disadvantage to this system is that the meter jaw buses do not always align with the fixed bus tabs on the meters, thereby preventing the meter from being installed. This problem may arise for several reasons. First, the enclosure is typically a thin metal housing that may flex, or "oil can," when pressure is applied. Pressure is typically applied when a meter being installed contacts one cantilevered end prior to other cantilevered ends. The flexing of the enclosure allowed the cantilevered ends to move out of alignment. Second, the L-shaped buses may shift on the base unit, or, the base unit may shift relative to the enclosure. Such a shift may occur over time or may result from something forcefully contacting the meter jaw bus assembly, for example, a misaligned meter. Third, the buses are, typically, made from a malleable metal and may bend when pressure is applied or become bent.

There is, therefore, a need for a spacing stabilizer structured to hold the L-shaped bus second ends in the proper alignment.

Because the spacing stabilizer does not have to remain on the meter jaw buses after the meter is installed, there is a further need for the spacing stabilizer to be easily removable.

SUMMARY OF THE INVENTION

These needs, and others, are met by the present invention which provides a removable spacing stabilizer. The spacer is, preferably, structured to engage a jaw meter assembly having four buses wherein there are two pairs of aligned buses. The spacer is made from a non-conductive material shaped as a body having four positioning slots. The positioning slots are arranged to correspond to the positions of the meter assembly bus tabs. Thus, when the removable spacing stabilizer is installed in the meter jaw buses, the meter jaw buses are held in the proper alignment for engaging the meter assembly.

The body is preferably flat and sized so that first and second lateral sides, which are two opposing sides of the body, contact the inner surface of the meter jaw buses. The positioning slots are formed by a T-shaped extension that extends from each lateral side. The top bar of each T-shaped extension is disposed within the plane of body. Thus, the positioning slots are located between the body lateral sides and the top bar of the T-shaped extensions. Each T-shaped extension is sized so that the inner surface of the top bar engages the outer surface of one of the meter jaw buses. Thus, the positioning slots formed by the body lateral sides and the T-shaped extensions engage both the inner and outer sides of the meter jaw buses. The size of the body and the T-shaped extensions are selected so that the positioning slots correspond to the pattern of the bus tabs on the meter assembly.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
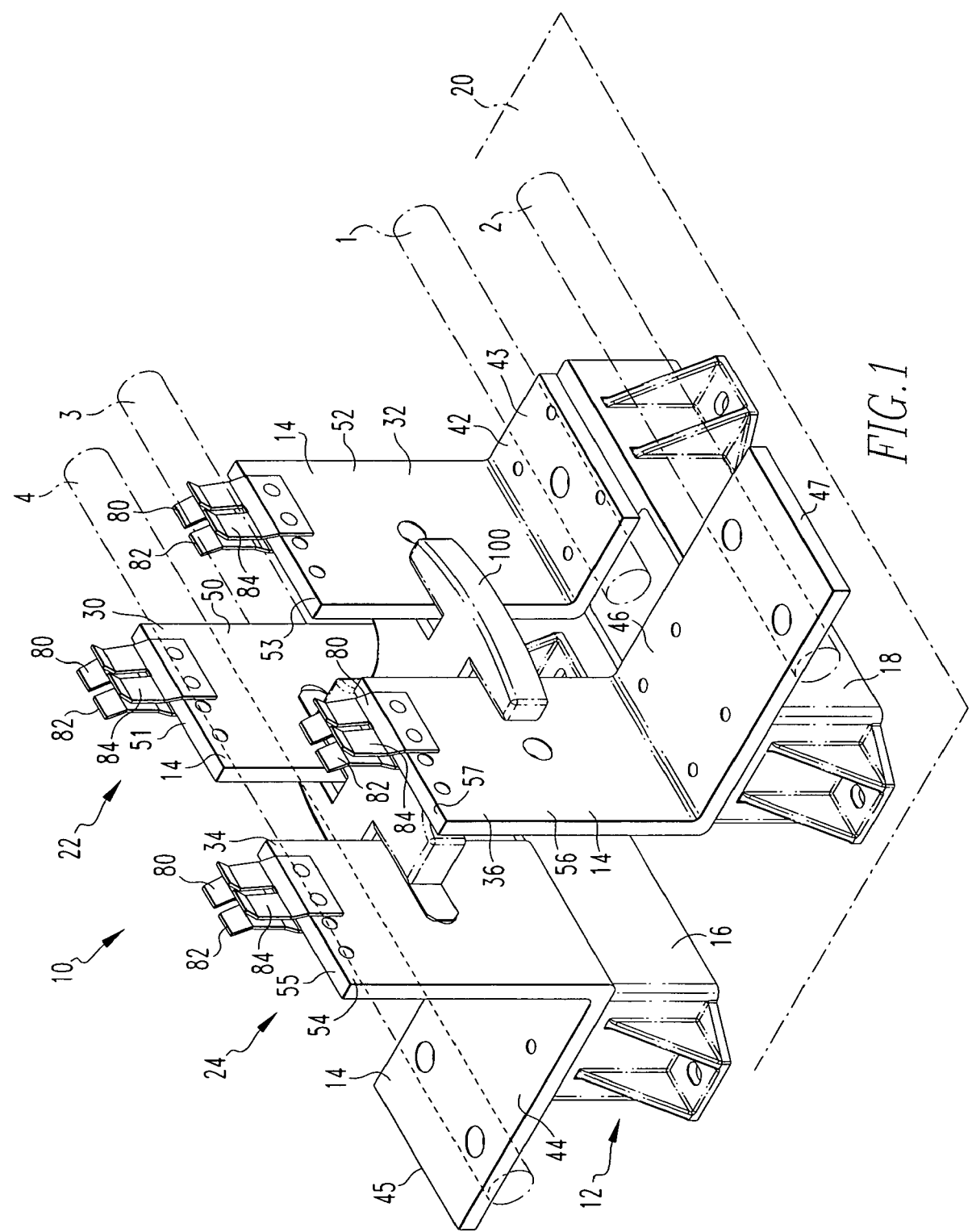
FIG. 1 is an isometric view of a jaw meter bus assembly.

Directional phrases used herein, such as upper, lower, front, back, etc., relate to the orientation of the elements shown in the drawings and are not limiting upon the claims.

Figure 2:
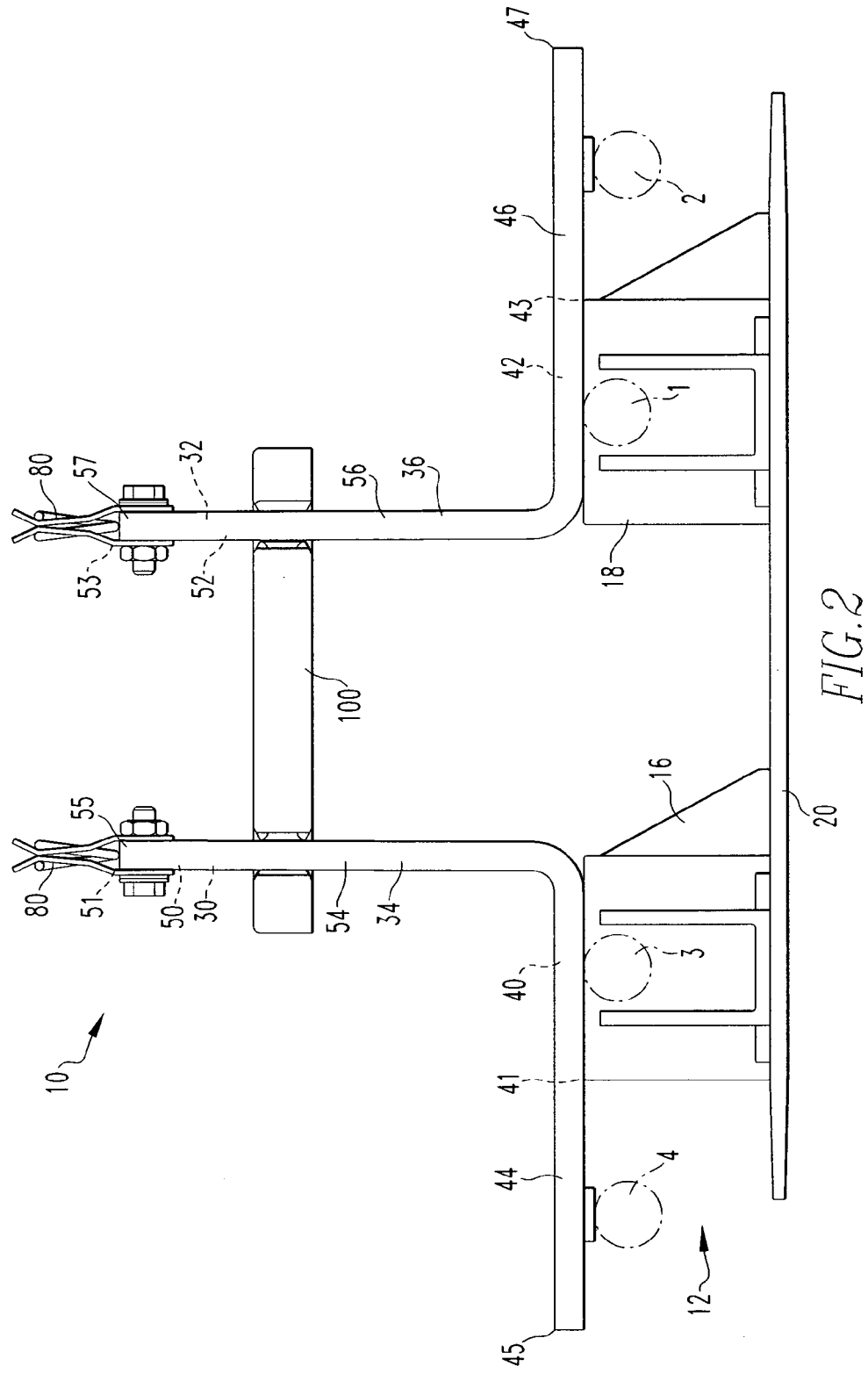
FIG. 2 is a side view of a jaw meter bus assembly.

As shown in FIGS. 1 and 2, a jaw meter bus assembly 10 includes a base assembly 12 and a plurality of meter buses 14. The base assembly 12 includes a first elongated base member 16 and a second elongated base member 18. The base assembly 12 is coupled to a panel 20 which is, typically, the rear wall of a meter enclosure (not shown), in a spaced relation. The enclosure further houses a first and second line bus 1, 2 (shown in ghost) and a first and second load bus 3, 4 (shown in ghost). The first and second base members 16, 18 are disposed with their longitudinal axis generally parallel. The base assembly 12 is made from a non-conductive material. The first and second base members 16, 18 each have a plurality of mounting points to which a bus may be attached.

The plurality of meter buses 14, as shown, includes four L-shaped buses disposed in an upper pair of buses 22 and a lower pair of buses 24. The upper pair of buses 22 includes a first bus 30 and a second bus 32. The lower pair of buses includes a third bus 34 and a fourth bus 36. The buses 30, 32, 34, 36 are made from a conductive material. The buses 30, 32, 34, 36 are, preferably, constructed from a generally flat, elongated bar that has been bent about ninety degrees, thereby forming an L-shape. That is, each bus 30, 32, 34, 36 includes a first leg 40 (FIG. 2), 42, 44, 46 having a first end 41 (FIG. 2), 43, 45, 47 and a second leg 50, 52, 54, 56 having a second end 51, 53, 55, 57, where the first leg 40, 42, 44, 46 is generally perpendicular to the second leg 50, 52, 54, 56. The first leg 40, 42 of the first and second buses 30, 32 have a truncated length and, typically, are shorter than the width of the base members 16, 18. The first leg 44, 46 of the third and fourth buses 34, 36 have an extended length and extend beyond the width of the base members 16, 18. The second leg 50, 52, 54, 56 of each bus 30, 32, 34, 36 have the same general length.

The plurality of meter buses 14 are coupled to the base assembly 12 in the following configuration. The first and third buses 30, 34 are coupled to the first base member 16. The second and fourth buses 32, 36 are coupled to the second base member 18. The buses 30, 32, 34, 36 are coupled to the base members 16, 18 by the first leg, 40, 42, 44, 46. When the buses 30, 32, 34, 36 are attached to the base members 16, 18, the first legs 40, 42, 44, 46 extend generally parallel to the panel 20. The first and second buses 30, 32 first legs 40, 42 extend in opposite directions. That is, as shown, the first bus first leg 40 extends to the left and the second bus first leg 42 extends to the right. Similarly, the third bus first leg 44 extends in a direction parallel to the first bus first leg 40 and the fourth bus first leg 46 extends generally parallel to the second bus first leg 42. The second legs 50, 52, 54, 56 extend away from the panel 20. That is, each second leg 50, 52, 54, 56 is cantilevered and extend toward the front of the enclosure (not shown). The first bus second leg 50 and the second bus second leg 52 are, generally, aligned and parallel with each other. The third bus second leg 54 and fourth bus second leg 56 are, generally, aligned and parallel with each other. The first bus second leg 50 and the third bus second leg 54 are, generally, in the same plane. Similarly, the second bus second leg 52 and the fourth bus second leg 56 are, generally, in the same plane. Adjacent to the each second leg second end 51, 53, 55, 57 is one or more jaw assembly fastener openings 58.

Figure 3:
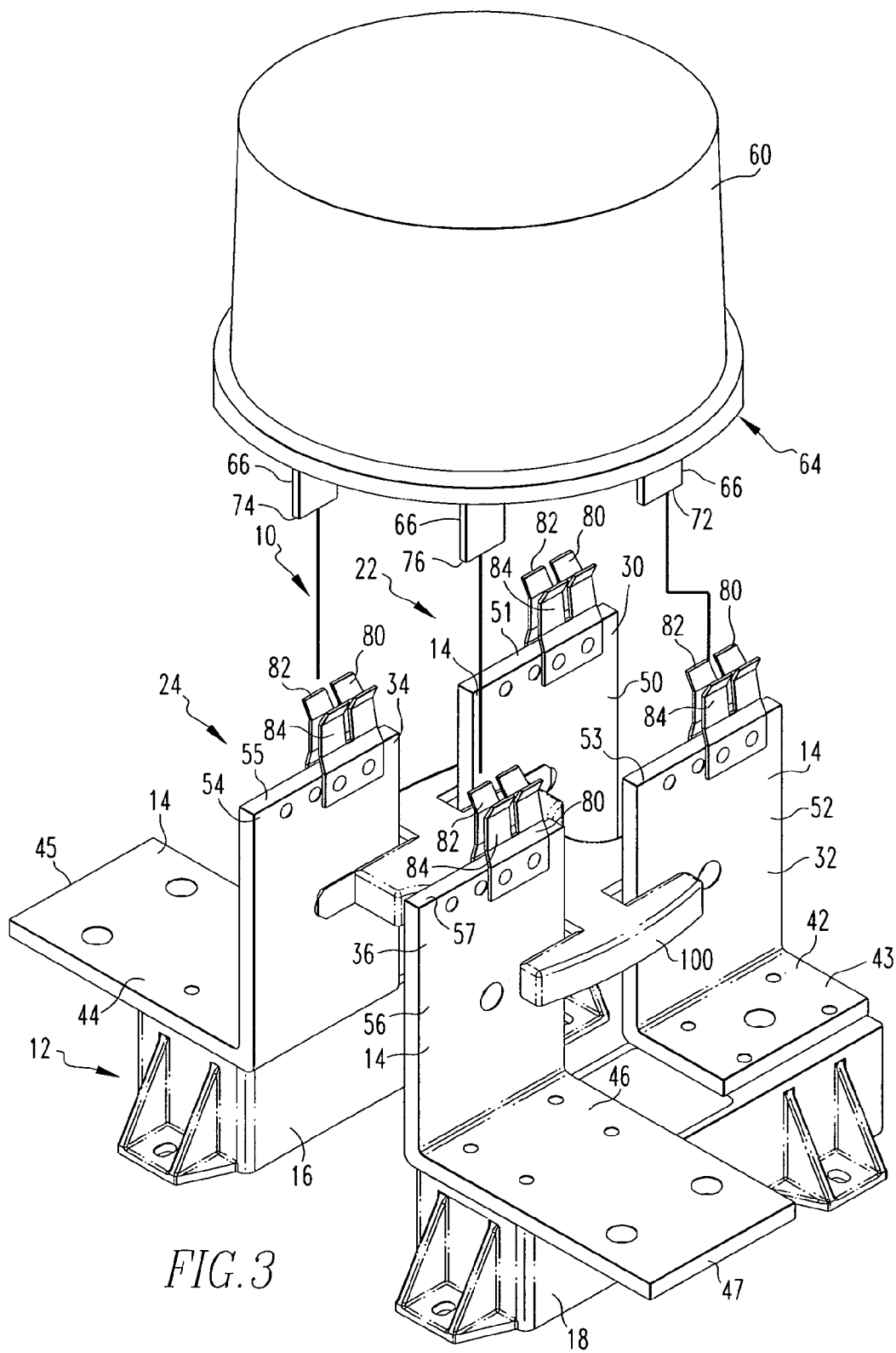
FIG. 3 is an isometric view of a jaw meter bus assembly including a meter.

A meter assembly 60, shown in FIG. 3, includes a housing 62 having a back surface 64. A metering device (not shown) is disposed within the housing 62. There is a plurality of bus tabs 66 extending from the back surface 64. The bus tabs 66 are structured to engage the meter bus second legs 50, 52, 54, 56. Thus, the bus tabs 66 include a first bus tabs (not shown), a second bus tabs 72, a third bus tabs 74, and a fourth bus tabs 76. The first bus tab and third bus tab 74 are generally disposed along a line and the second and fourth bus tabs 72, 76 are generally disposed along a line and are a mirror image of the first bus tab and third bus tab 74. The bus tabs 72, 74, 76 may have chamfered edges to assist in engaging the jaw assemblies 80 (described below). Each bus tab 72, 74, 76 is coupled to the metering device.

A jaw assembly 80 is disposed at each meter bus second end 51, 53, 55, 57. Each jaw assembly 80 includes at least two opposed fingers 82, 84. The opposed fingers 82, 84 are biased towards each other and are structured to engage the bus tabs 72, 74, 76.

Figure 4:
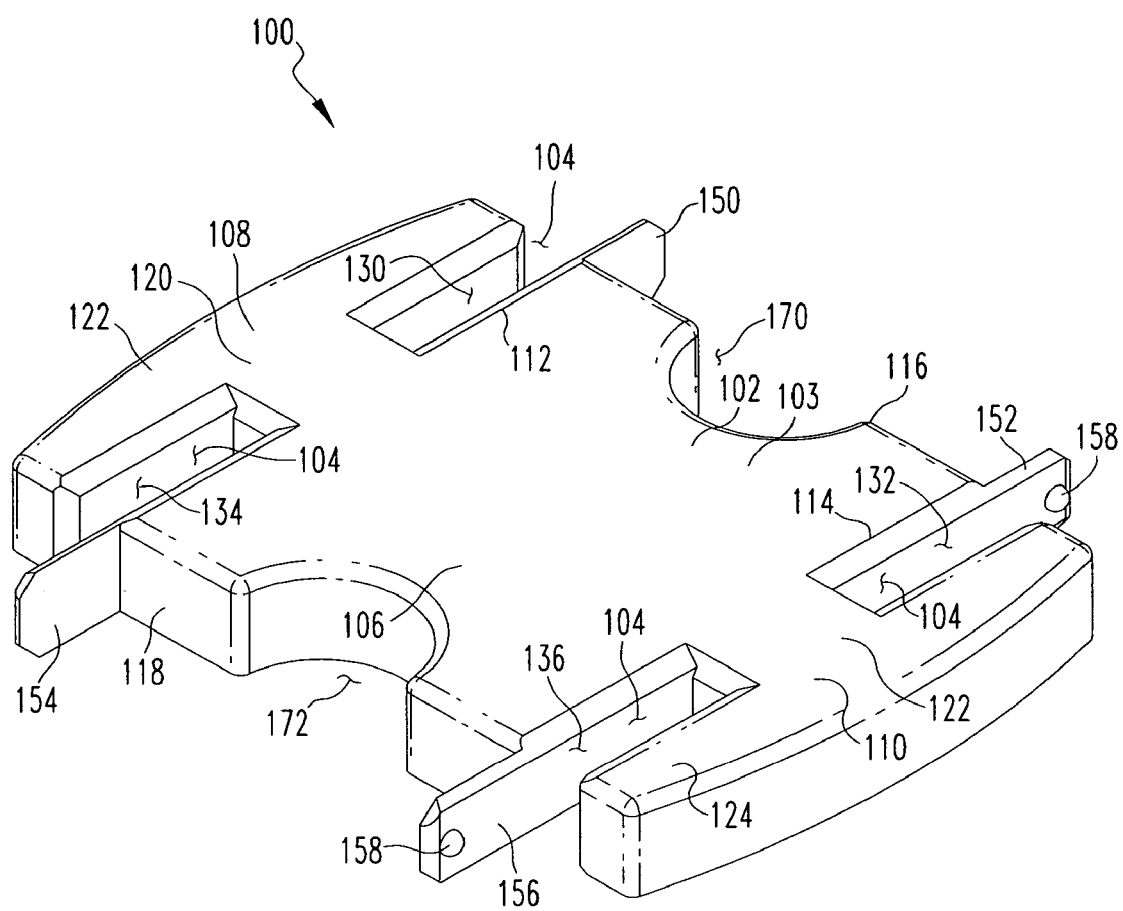
FIG. 4 is an isometric view of a removable spacing stabilizer.

As shown in FIG. 4, the removable spacing stabilizer 100 includes a generally planar member 102 having a front side 103, a back side (not shown) and plurality of positioning slots 104. The planar member 102 is, preferably, made from a non-conductive, substantially rigid material such as, but not limited to, Noryl® SE 1X. The planar member 102 includes a body portion 106 and a first and second T-shaped extension 108, 110. The body portion 106 is, preferably, generally a quadrilateral having first and second opposing lateral sides 112, 114, and opposing third and fourth sides 116, 118. The T-shaped extensions 108, 110 extend from opposite lateral sides 112, 114. The positioning slots 104 are defined by the openings between the T-shaped extensions 108, 110 and the lateral sides 112, 114. That is, each T-shaped extension 108, 110 has a column portion 120, 122 and a crossbar portion 124, 126. The column portion 120, 122 spaces the crossbar portion 124, 126 away from the body portion 106 thereby creating the positioning slots 104.

In this configuration, the plurality of positioning slots 104 includes four slots, a first slot 130, a second slot 132, a third slot 134, and a fourth slot 136. Additionally, the first and second slots 130, 132 are, generally, aligned and parallel with each other but on opposite sides of the body portion 106. Similarly, the third and fourth slots 134, 136 are, generally, aligned and parallel with each other but on opposite sides of the body portion 106. Also, the longitudinal axis of the first and third slots 130, 134 are, generally, aligned and the longitudinal axis of the second and fourth slots 132, 136 are, generally, aligned. This is the same configuration as the bus tabs 72, 74, 76 on the meter assembly 60. The column portion 120, 122 of each T-shaped extension 108, 110 is sized so that each positioning slot 130, 132, 134, 136 has a width sufficient to snuggly engage each second leg 50, 52, 54, 56. That is, each second leg 50, 52, 54, 56 will fit within each positioning slot 130, 132, 134, 136 while contacting both the body portion 106 and one of the T-shaped extensions 108, 110.

Each positioning slot 130, 132, 134, 136 has an edge 140, 142, 144, 146. Each slot edge 140, 142, 144, 146 extends along the body portion lateral side 112, 114, and the T-shaped extension 108, 110 associated with each positioning slot 130, 132, 134, 136. Each edge 140, 142, 144, 146 is, preferably, chamfered. The chamfered edge 140, 142, 144, 146 aides in allowing the removable spacing stabilizer 100 to engage the second legs 50, 52, 54, 56 as described below. The edges along the back side of the spacing stabilizer (not shown) may also be chamfered.

Each positioning slot 130, 132, 134, 136 may also include a flat alignment tab 150, 152, 154, 156. Each alignment tab 150, 152, 154, 156 includes a detent 158 disposed facing the slot 130, 132, 134, 136. As shown, each alignment tab 150, 152, 154, 156 extends from, and is generally parallel to, either lateral side 112, 114 associated with each positioning slot 130, 132, 134, 136. The detent 158 on each alignment tab 150, 152, 154, 156 is structured to engage the opening 58 located on each second leg second end 51, 53, 55, 57 as described below.

The body portion third and fourth sides 116, 118 may each include a finger grip cut-out 170, 172. Each finger grip cut-out 170, 172 is, preferably, a semi-circular notch sized to be gripped by human fingers.

In operation, the removable spacing stabilizer 100 is used as follows. Initially, the jaw meter bus assembly 10 is exposed, i.e., the enclosure is open, and is free from a meter assembly 60. The second legs 50, 52, 54, 56 extend toward the front of the enclosure as cantilevered portions of the meter buses 14. The removable spacing stabilizer 100 is oriented so that the plane of the removable spacing stabilizer 100 is generally perpendicular to the panel 20 and so that the T-shaped extensions 108, 110 are disposed on the outer sides of the first and third bus second legs 50, 54, and the second and fourth bus second legs 52, 56, respectively. The removable spacing stabilizer 100 is then moved into the gap between the upper and lower pairs of buses 22, 24. The removable spacing stabilizer 100 is then rotated so that the first and second positioning slots 130, 132 engage the first bus second leg 50 and the second bus second leg 52. The chamfered edges 140, 142 assist in guiding the first bus second leg 50 and the second bus second leg 52 into the first and second positioning slots 130, 132. After, or at the same time as, the first and second positioning slots 130, 132 engage the first bus second leg 50 and the second bus second leg 52, the third and fourth positioning slots 134, 136 engage the third bus second leg 54 and the fourth bus second leg 56. As described above, the positioning slots 130, 132, 134, 136 snugly engage the bus second legs 50, 52, 54, 56. Moreover, because the removable spacing stabilizer 100 is made from a rigid material, the act of engaging the bus second legs 50, 52, 54, 56 cause the second legs 50, 52, 54, 56 to move into a position corresponding to the alignment of the positioning slots 130, 132, 134, 136. That is, if the bus second legs 50, 52, 54, 56 had not been aligned due to a warped panel 20, the act of engaging the bus second legs 50, 52, 54, 56 with the removable spacing stabilizer 100 would move the bus second legs 50, 52, 54, 56 to a selected orientation, that is, aligned with the positioning slots 130, 132, 134, 136. Additionally, the removable spacing stabilizer 100 may be temporarily fixed to the bus second legs 50, 52, 54, 56 by moving the detent 158 on each alignment tab 150, 152, 154, 156 into the opening 58 on each bus second legs 50, 52, 54, 56.

Once the bus second legs 50, 52, 54, 56 are aligned, a meter assembly 60 may be mounted on the bus second legs 50, 52, 54, 56. That is the meter assembly 60 is positioned above the bus second legs 50, 52, 54, 56 so that the bus second legs 50, 52, 54, 56 are aligned with the bus tabs 72, 74, 76. Unless the user is very careful, as the meter assembly 60 is moved to engage the bus second legs 50, 52, 54, 56, it is likely that the meter assembly 60 will contact a single bus second leg 50, 52, 54, 56. But for the removable spacing stabilizer 100, the act of contacting a single bus second leg 50, 52, 54, 56 could cause the panel 20 to oil can, or flex. Thus, without the removable spacing stabilizer 100, the bus second legs 50, 52, 54, 56 would be moved into misalignment. However, as the removable spacing stabilizer 100 is in place, the bus second legs 50, 52, 54, 56 remain aligned with the bus tabs 72, 74, 76 and the meter assembly 60 is moved into engagement with the meter jaw bus assembly 10. To remove the removable spacing stabilizer 100, the user merely rotates the removable spacing stabilizer 100 so that the bus second legs 50, 52, 54, 56 move out of the positioning slots 130, 132, 134, 136 so that the removable spacing stabilizer 100 may be pulled from the gap between the upper and lower pairs of buses 22, 24. Alternatively, the removable spacing stabilizer 100 may be left in place to stabilize the plurality of meter buses 14.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A removable spacing stabilizer for a jaw meter bus assembly, said jaw meter bus assembly having two pairs of generally parallel flat, elongated busses, each bus having a cantilevered second leg, said removable spacing stabilizer comprising:
   a generally planar member made from a generally rigid, non-conductive material;
   said planar member having a positioning slot for each said bus cantilevered second leg; and
   whereby said planar member may be coupled to said jaw meter bus assembly with each bus cantilevered leg disposed in a positioning slot and whereby said bus cantilevered legs are held in a selected orientation.

2. The removable spacing stabilizer of claim 1, comprising; alignment tabs, wherein said meter assembly comprises tabs, wherein the selected alignment tabs corresponds to the alignment of bus tabs on said meter assembly.

3. The removable spacing stabilizer of claim 2, wherein said positioning slots include four slots, a first slot, a second slot, a third slot, and a fourth slot; and
   wherein said first slot and said second slot are, generally, aligned and parallel with each other, said third slot and said fourth slot are, generally, aligned and parallel with each other, said first slot and said third slot are, generally, in the same plane, and said second slot and said fourth slot are, generally, in the same plane.

4. The removable spacing stabilizer of claim 1, wherein said planar member includes:
   a body portion having first and second lateral sides, said first and second lateral sides disposed on opposite sides of said body portion;
   a first T-shaped extension extending from said first side;
   a second T-shaped extension extending from said second side; and
   wherein each said T-shaped extension defines a pair of said positioning slots.

5. The removable spacing stabilizer of claim 4, wherein said positioning slots have chamfered edges.

6. The removable spacing stabilizer of claim 4, wherein at least one said bus has an opening and wherein:
   at least one said positioning slot includes an alignment tab; and
   said alignment tab extends adjacent to said positioning slot and has a detent structured to engage said bus opening.

7. The removable spacing stabilizer of claim 4, wherein said body portion is generally rectangular with a third and fourth side that are generally parallel to each other and generally perpendicular to said first and second sides; and
   said third and fourth sides each having a finger grip cut-out therein.

8. The removable spacing stabilizer of claim 4, wherein said body portion is made from a non-conductive material.

9. The removable spacing stabilizer of claim 1, wherein said positioning slots have chamfered edges.

10. The removable spacing stabilizer of claim 1, wherein said generally planar member comprises a body portion;
    wherein said body portion is generally rectangular with first and second lateral sides, said first and second lateral sides disposed on opposite sides of said body portion, and a third and fourth side that are generally parallel to each other and generally perpendicular to said first and second lateral sides; and
    said third and fourth sides each having a finger grip cut-out therein.

11. A jaw meter bus assembly having a removable spacing stabilizer comprising:
a base assembly having a first and second base member, each base member structured to be coupled to a panel;
a plurality of metered buses coupled to said base assembly, each metered bus having a flat, cantilevered second leg;
a removable spacing stabilizer comprising:
a generally planar member made from a generally rigid, non-conductive material;
said planar member having a positioning slot for each said bus cantilevered second leg;
whereby said planar member may be coupled to said jaw meter bus assembly with each bus cantilevered leg disposed in a positioning slot and whereby said bus cantilevered legs are held in a selected orientation.

12. The jaw meter bus assembly of claim 11, wherein said plurality of metered buses includes an upper pair and a lower pair of L-shaped bus members;
each L-shaped bus including a first end and said second cantilevered leg;
said upper pair of buses having a first bus and a second bus;
said lower pair of buses having a third bus and a fourth bus;
and wherein said first bus second leg and said second bus second leg are, generally, aligned and parallel with each other, said third bus second leg and said fourth bus second leg are, generally, aligned and parallel with each other, said first bus second leg and said third bus second leg are, generally, in the same plane, and said second bus second leg and said fourth bus second leg are, generally, in the same plane.

13. The jaw meter bus assembly of claim 12, wherein said positioning slots include four slots, a first slot, a second slot, a third slot, and a fourth slot; and
wherein said first slot and said second slot are, generally, aligned and parallel with each other, said third slot and said fourth slot are, generally, aligned and parallel with each other, said first slot and said third slot are, generally, in the same plane, and said second slot and said fourth slot are, generally, in the same plane.

14. The jaw meter bus assembly of claim 11, wherein said planar member includes:
a body portion having first and second lateral sides, said first and second lateral sides disposed on opposite sides of said body portion;
a first T-shaped extension extending from said first side;
a second T-shaped extension extending from said second side; and
wherein each said T-shaped extension defines a pair of said positioning slots.

15. The jaw meter bus assembly of claim 14, wherein said positioning slots have chamfered edges.

16. The jaw meter bus assembly of claim 14, wherein
at least one said bus has an opening;
at least one said positioning slot includes an alignment tab; and
said alignment tab extends adjacent to said positioning slot and has a detent structured to engage said bus opening.

17. The jaw meter bus assembly of claim 14, wherein
said body portion is generally rectangular with a third and fourth side that are generally parallel to each other and generally perpendicular to said first and second sides; and
said third and fourth sides each having a finger grip cut-out therein.

18. The jaw meter bus assembly of claim 14, wherein said body portion is made from a non-conductive material.

19. The jaw meter bus assembly of claim 11, wherein said positioning slots have chamfered edges.

20. The jaw meter bus assembly of claim 11, wherein said generally planar member comprises a body portion;
wherein said body portion is generally rectangular with first and second lateral sides, said first and second lateral sides disposed on opposite sides of said body portion, and a-third and fourth sides that are generally parallel to each other and generally perpendicular to said first and second lateral sides; and
said third and fourth sides each having a finger grip cut-out therein.

* * * * *